(12) United States Patent
Kim

(10) Patent No.: US 7,932,554 B2
(45) Date of Patent: Apr. 26, 2011

(54) SEMICONDUCTOR DEVICE HAVING A MODIFIED RECESS CHANNEL GATE AND A METHOD FOR FABRICATING THE SAME

(75) Inventor: Tae Kyun Kim, Yongin-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 265 days.

(21) Appl. No.: 11/768,731

(22) Filed: Jun. 26, 2007

(65) Prior Publication Data
US 2008/0157190 A1 Jul. 3, 2008

(30) Foreign Application Priority Data
Dec. 28, 2006 (KR) .......................... 10-2006-0137134

(51) Int. Cl.
*H01L 29/66* (2006.01)
(52) U.S. Cl. .. 257/330; 257/315; 257/534; 257/E29.201
(58) Field of Classification Search .................. 257/315, 257/330, 534, E29.201
See application file for complete search history.

(56) References Cited

U.S. PATENT DOCUMENTS

| 6,239,465 | B1 | 5/2001 | Nakagawa | 257/331 |
|---|---|---|---|---|
| 2005/0042833 | A1 | 2/2005 | Park et al. | 438/282 |
| 2005/0087776 | A1 | 4/2005 | Kim | |
| 2006/0118889 | A1* | 6/2006 | Suh | 257/404 |
| 2006/0128138 | A1* | 6/2006 | Xin | 438/627 |
| 2006/0211203 | A1 | 9/2006 | Kim et al. | 438/259 |
| 2006/0273381 | A1 | 12/2006 | Kim et al. | 257/330 |

FOREIGN PATENT DOCUMENTS

| KR | 1020040051931 A | 6/2004 |
|---|---|---|
| KR | 1020060039366 A | 5/2006 |

* cited by examiner

*Primary Examiner* — Kenneth A Parker
*Assistant Examiner* — Dale Page
(74) *Attorney, Agent, or Firm* — Marshall, Gerstein & Borun LLP

(57) ABSTRACT

A semiconductor device having a modified recess channel gate includes active regions defined by a device isolation layer and arranged at regular intervals on a semiconductor substrate, each active region extending in a major axis and a minor axis direction, a trench formed in each active region, the trench including a stepped bottom surface in the minor axis direction of the active region, and a recess gate formed in the trench.

7 Claims, 7 Drawing Sheets

PRIOR ART

SEMICONDUCTOR DEVICE HAVING A MODIFIED RECESS CHANNEL GATE AND A METHOD FOR FABRICATING THE SAME

CROSS-REFERENCE TO RELATED APPLICATION

Priority to Korean patent application number 10-2006-0137134, filed on Dec. 28, 2006, the disclosure of which is incorporated by reference in its entirety, is claimed.

BACKGROUND OF THE INVENTION

The invention relates to a semiconductor device and a method for fabricating the same, and more particularly to a semiconductor device having a modified recess channel gate and a method for fabricating the same.

As the design rule of semiconductor devices becomes finer, the gate channel length becomes smaller. Accordingly, in semiconductor devices having gate channel lengths of 70 nm or less, it is difficult to set a critical voltage with a planar channel structure. Thus, semiconductor devices having various recess channel gates have been proposed to efficiently and substantially increase the effective channel length.

Referring to FIG. 1, a device isolation region 110 is disposed on a semiconductor substrate 100 (see FIG. 2) to define an active region 101. A gate line 121 is disposed in the direction across the active region 101. The gate line 121 may be understood as a recess channel gate for increasing the effective channel length.

FIG. 2 illustrates a major axis cross section taken along a line A-A' in FIG. 1 and FIG. 3 illustrates a minor axis cross section taken along a line B-B' in FIG. 1.

Referring to FIG. 2, a recess channel trench 120 is formed by etching the active region 101 of the semiconductor substrate 100. When the recess channel trench 120 is formed, a major axis length 102 of the active region becomes longer and the effective channel length increases. On the other hand, referring to FIG. 3, a minor axis length 103 of the active region does not change even after the recess channel trench 120 is formed, so that there is no increase in the effective channel width.

As mentioned above, a semiconductor device having a recess channel gate has an increased effective channel length. However it is difficult to increase the effective channel width.

BRIEF SUMMARY OF THE INVENTION

An aspect of the invention provides a semiconductor device having a modified recess channel gate including: active regions defined by a device isolation layer and arranged at regular intervals on a semiconductor substrate, each active region extending in a major axis direction and a minor axis direction; a trench formed in each active region, the trench including a stepped bottom surface in the minor axis direction of the active region; and a recess gate formed in the trench. A step formed on the bottom surface of the trench preferably has a depth of 100 Å to 500 Å relative to the surface of the semiconductor substrate. The trench preferably has a depth of 1000 Å to 1500 Å. The recess gate preferably includes a gate insulating layer, a gate conductive layer and a hard mask layer.

BRIEF DESCRIPTION OF THE DRAWINGS

The above and other objects, features, and other advantages of the invention will be more clearly understood from the following detailed description taken in conjunction with the accompanying drawings, in which.

DETAILED DESCRIPTION OF THE INVENTION

Figure 1:
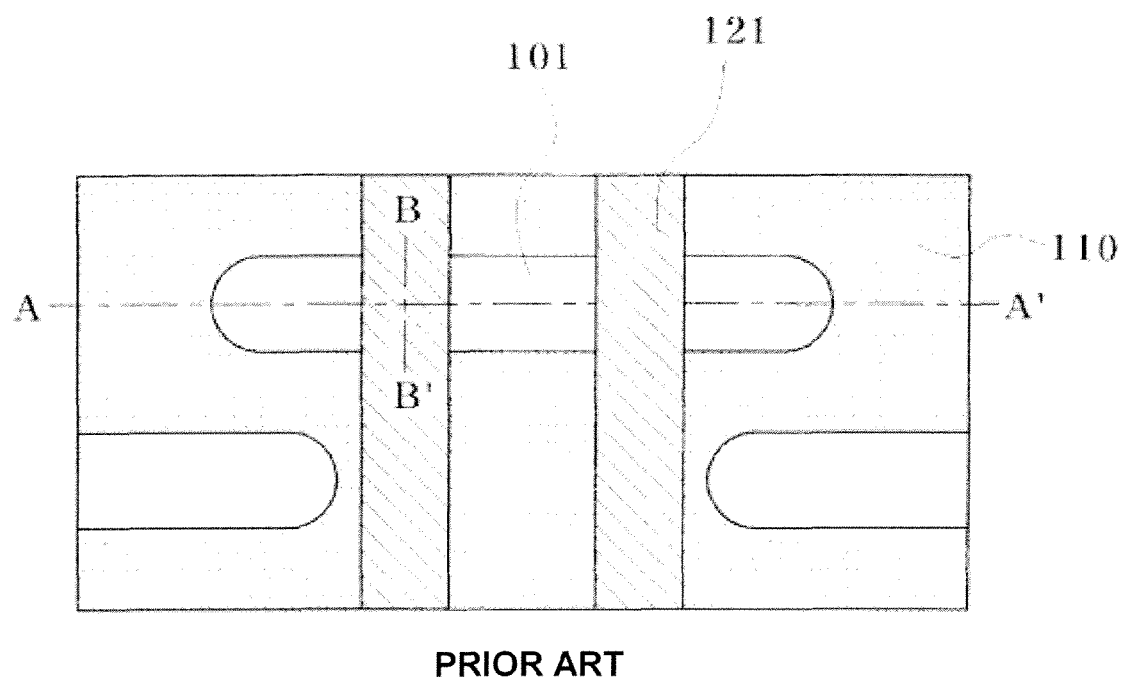
FIG. 1 is a plan view illustrating a conventional semiconductor device having a recess channel gate.
Figure 2:
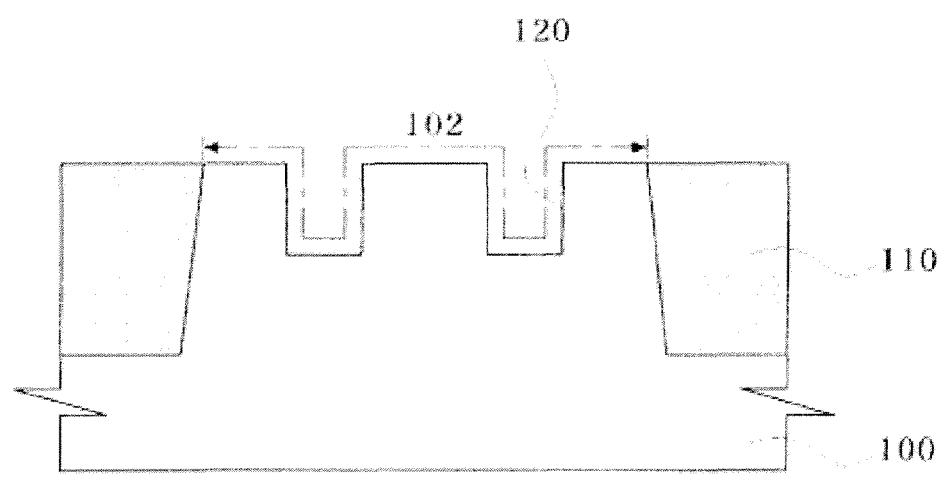
FIGS. 2 and 3 are cross sectional views illustrating the conventional recess channel gate trench structure of FIG. 1.
Figure 3:
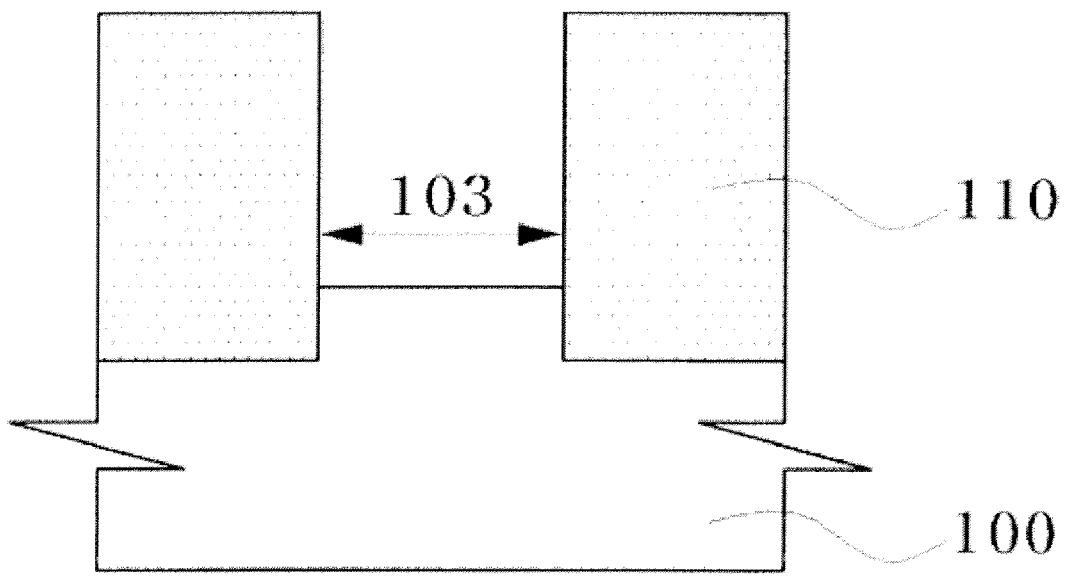

Preferred embodiments of the invention are described in detail with reference to the accompanying drawings. These embodiments are used only for illustrative purposes, and the invention is not limited thereto. In the drawings, the thickness of various elements is enlarged for clarity, and like reference numerals designate like parts having practically the same functions.

Figure 4:
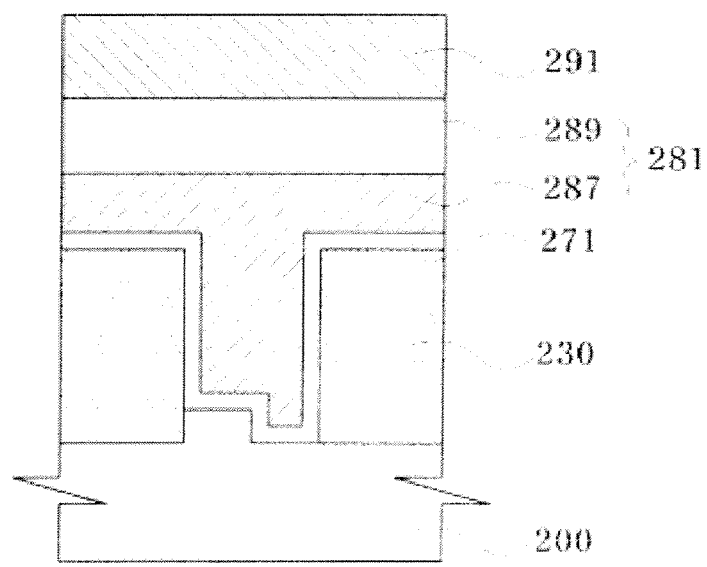
FIG. 4 is a cross sectional view illustrating a semiconductor device having a modified recess channel gate and a method of fabricating the semiconductor device according to the invention.

Referring to FIG. 4, in a semiconductor device having a modified recess channel gate according to the invention, active regions 201 (FIG. 5) are defined in a semiconductor substrate 200 by a device isolation layer 230 (FIG. 5) disposed on the semiconductor substrate 200. The active regions 201 extending in major axis and minor axis directions (FIG. 5) may be arranged at regular intervals on the semiconductor substrate 200. A modified recess channel trench 260 (FIG. 11) is disposed in each active region 201 of the semiconductor substrate 200. The modified recess channel trench 260 extends along the major axis direction of the active region 201. The trench 260 may have a bottom surface stepped in the minor axis direction of the active region 201, thereby increasing the effective channel width.

A recess gate is disposed in the recess channel trench 260. The recess gate includes a gate insulating layer 270, a gate conductive layer 280 and a hard mask layer 290 (FIG. 13) The gate insulating layer 270 may be formed of an insulating material such as silicon oxide having a thickness of 30 Å to 50 Å. The gate conductive layer 280 may include a polysilicon layer having a thickness of 500 Å to 1,000 Å and a tungsten silicide layer 290 having a thickness of 1,000 Å to 1,200 Å. The hard mask layer is formed of an insulating material such as silicon nitride having a thickness of 2,000 Å to 2,500 Å.

Figure 5:
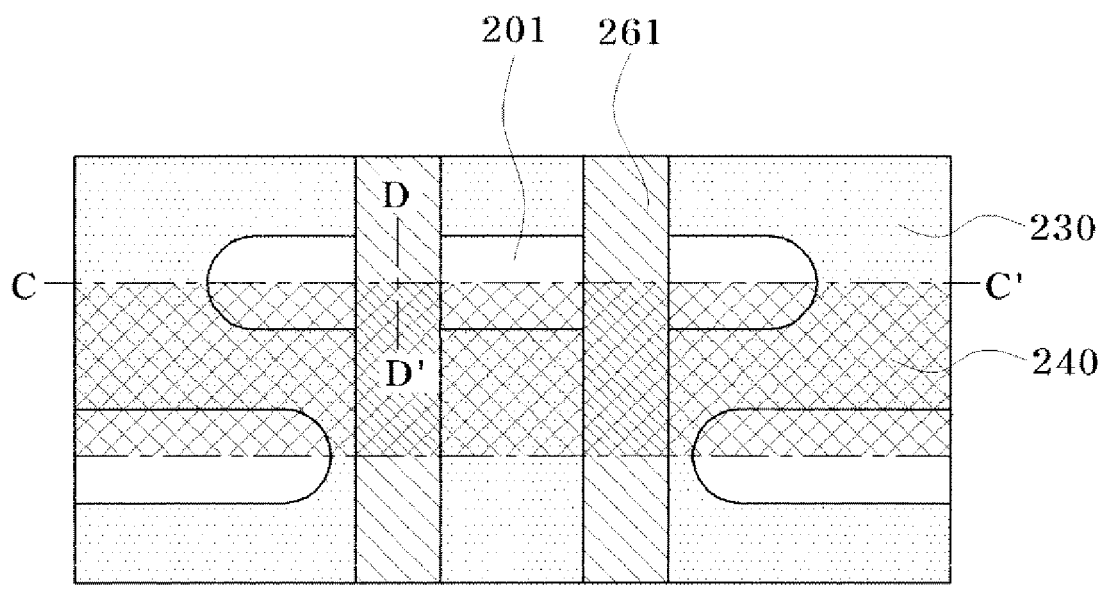
FIG. 5 is a plan view for illustrating the semiconductor device having the modified recess channel gate.

Referring to FIG. 5, an active region 201 of the semiconductor substrate 200 is defined by a device isolation region. Gate lines 261 are arranged regularly in a direction across the active region 201. Each gate line 261 has a modified recess channel structure to increase the effective channel length and the effective channel width. A mask pattern 240 is a pattern for etching the semiconductor substrate 200 to increase the effective channel width.

FIGS. 6, 7, 10, 11, 13, and 14 are major axis cross sections taken along a line C-C' in FIG. 5. FIGS. 8, 9, 12, and 15 are minor axis cross sections taken along a line D-D' in FIG. 5. The length of the active region 201 extending the major axis direction is generally larger than the width of the active region 201 extending in the minor axis direction.

Figure 6:
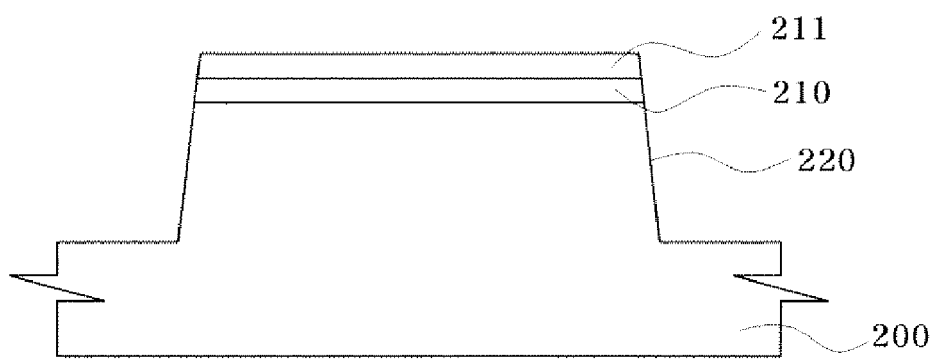
FIGS. 6 to 15 are cross sectional views illustrating a method of fabricating the semiconductor device having the modified recess channel gate.

Referring to FIG. 6, in a method for fabricating a semiconductor device having a modified recess channel gate according to the invention, a pad oxide layer 210 and a pad nitride layer 211 are formed on the semiconductor substrate 200. The pad oxide layer 210 is preferably formed to have a thickness of 50 Å to 150 Å. The pad nitride layer 211 is preferably formed to have a thickness of 500 Å to 1,000 Å.

A device isolation trench 220 is formed by selectively etching the pad nitride layer 211, the pad oxide layer 210 and the semiconductor substrate 200 through a mask pattern (not shown) formed on the active region 201. The device isolation trench 220 is preferably formed to have a depth of 2,000 Å to 3,000 Å relative to the top surface of the semiconductor substrate 200.

Figure 7:
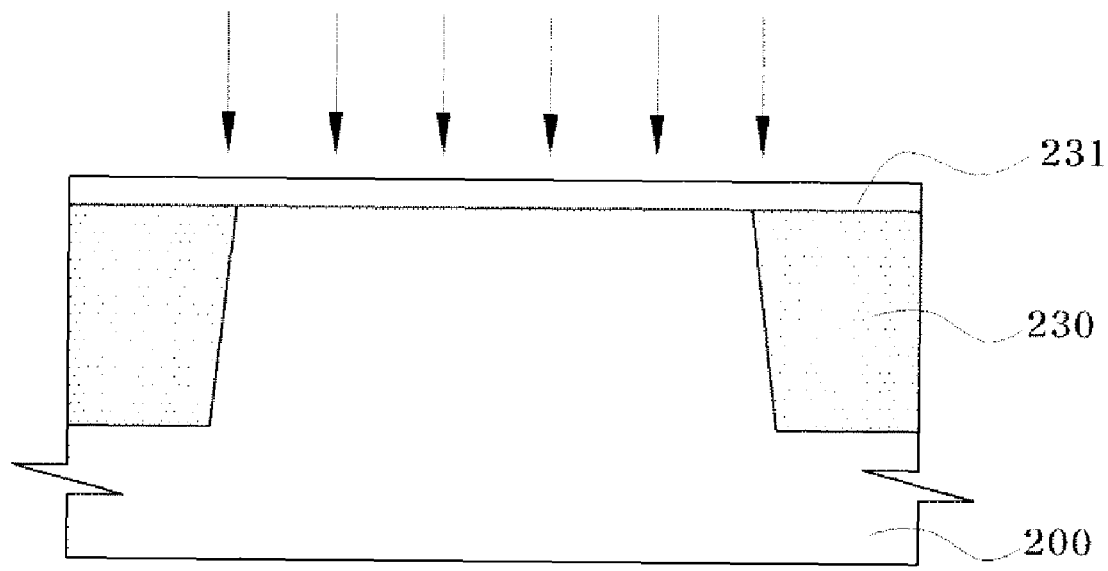

Referring to FIG. 7, a field oxide layer is formed by depositing an insulating layer on the entire surface to bury the device isolation trench 220. A planarization process (e.g., a chemical mechanical polishing (CMP) process) is performed on the field oxide layer, thereby forming a device isolation layer 230 for defining the active region 201 after removing the pad oxide layer 210 and the pad nitride layer 211.

An impurity ion implanting process and a heat treatment process are performed to form a well or channel in the semiconductor substrate 200 with the device isolation layer 230 formed thereon. Before performing the impurity ion implanting process and the heat treatment process, a screen oxide layer 231 may be formed on the semiconductor substrate 200. The screen oxide layer 231 prevents damage to the semiconductor substrate 200 during the impurity ion implanting process.

Further, the impurity ion implanting process and the heat treatment process may be performed after the device isolation trench 220 is formed. In a cleaning process performed while forming the device isolation layer 230, a step (not shown) between the device isolation layer 230 and the surface of the active region 201 can be optionally adjusted by controlling cleaning conditions.

Figure 8:
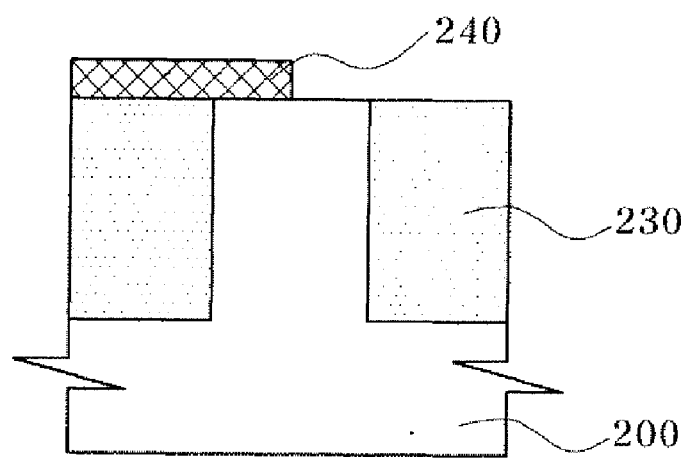

Referring to FIG. 8, the mask pattern 240 is formed on the semiconductor substrate 200. As shown in FIG. 5, the mask pattern 240 extends in the major axis direction and is formed such that a half of the active region 201 is exposed in the minor axis direction. The mask pattern 240 is a pattern for forming a step in the minor axis direction of the active region 201 to increase the effective channel width. The size or position of the mask pattern 240 may vary within a range capable of forming the step in the active region 201.

Figure 9:
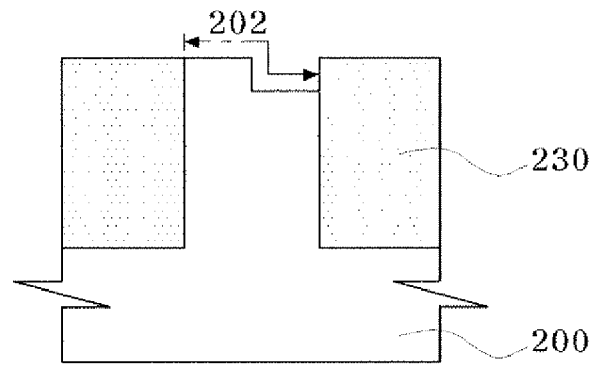

Referring to FIG. 9, the semiconductor substrate 200 exposed by the mask pattern 240 of FIG. 8 is etched to a depth of 100 Å to 500 Å and the mask pattern 240 is subsequently removed. Since the mask pattern 240 exposes at least a half of the active region 201 in the minor axis direction, a step is formed in the active region 201 in the minor axis direction in an etching process. By forming the step, an effective length 202 of the active region 201 can increase relative to the width of the active region 201 in the minor axis direction.

Figure 10:
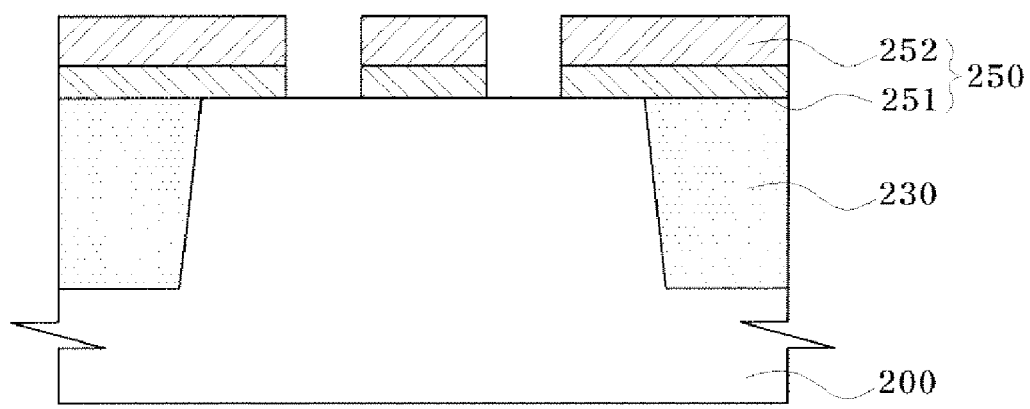

Referring to FIG. 10, a mask layer 250 for forming a recess channel is formed on the semiconductor substrate 200 after removing the mask pattern 240. The mask layer 250 may be formed by sequentially laminating, for example, an oxide layer 251 and a polysilicon layer 252. The oxide layer 251 may have a thickness of 50 Å to 200 Å. The polysilicon layer 252 may have a thickness of 300 Å to 800 Å. The mask layer 250 has a step not shown in the minor axis direction due to the step formed in the minor axis direction of the active region 201 (see FIG. 9). The mask layer 250 is selectively etched using a recess channel mask (not shown) to form a patterned mask layer 250. The patterned mask layer 250 exposes a portion of the semiconductor substrate 200 where a recess channel trench will be formed.

Figure 11:
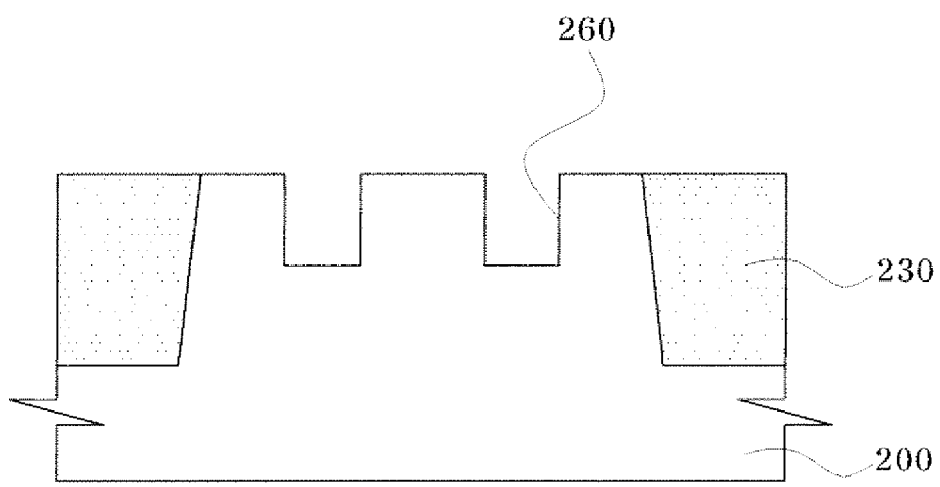
Figure 12:
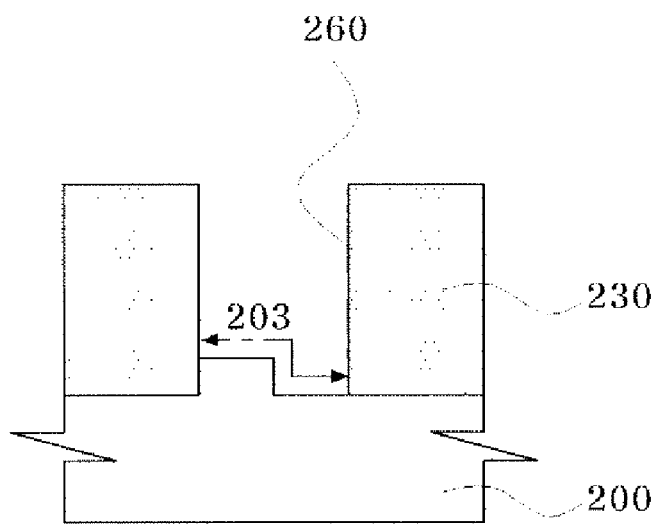

Referring to FIGS. 11 and 12, the semiconductor substrate 200 is selectively etched using the patterned mask layer 250 as an etching mask to form a modified recess channel trench 260. The recess channel trench 260 is preferably formed to have a depth of 1,000 Å to 1,500 Å relative to the top surface of the semiconductor substrate 200. Specifically, the recess channel trench 260 is formed to have a bottom surface stepped in the minor axis direction of the active region 201 due to the step originally formed on the surface of the semiconductor substrate 200 (see FIG. 9). By forming the step in the minor axis direction of the recess channel trench 260, a minor axis length 203 of the active region 201 increases relative to the width of the active region 201, thereby increasing the effective channel width.

Figure 13:
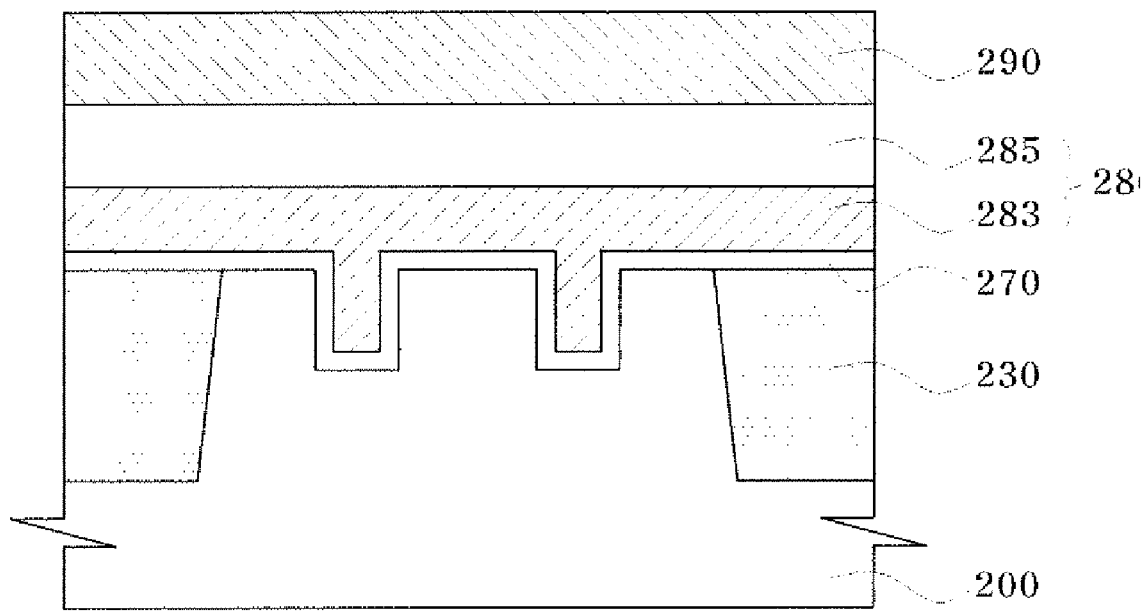

Referring to FIG. 13, a gate insulating layer 270 and a gate conductive layer 280 are formed over the entire surface of the semiconductor substrate 200 with the recess channel trench 260 formed thereon. The gate insulating layer 270 may be formed of silicon oxide. The gate insulating layer 270 preferably has a thickness of 30 Å to 50 Å. The gate conductive layer 280 may be formed to include a polysilicon layer 283 and a tungsten silicide layer 285. The polysilicon layer 283 preferably has a thickness of 500 Å to 1,000 Å. The tungsten silicide layer 285 preferably has a thickness of 1,000 Å to 1,200 Å.

A hard mask layer 290 is formed on the gate conductive layer 280. The hard mask layer 290 is preferably formed of an insulating material such as silicon nitride to have a thickness of 2,000 Å to 2,500 Å.

Figure 14:
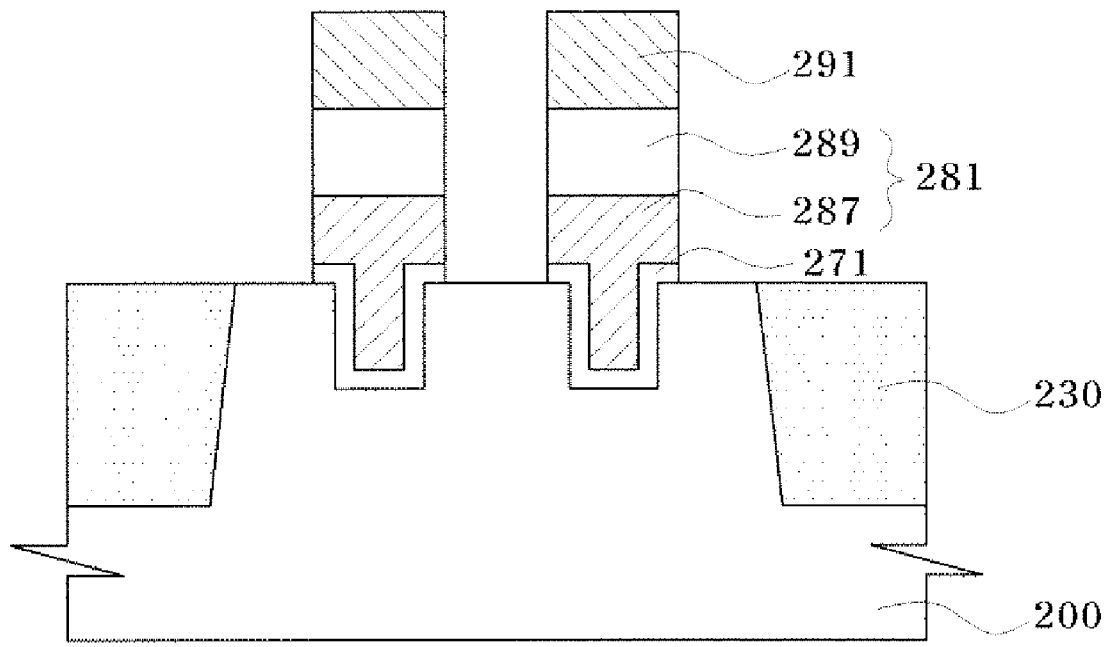
Figure 15:
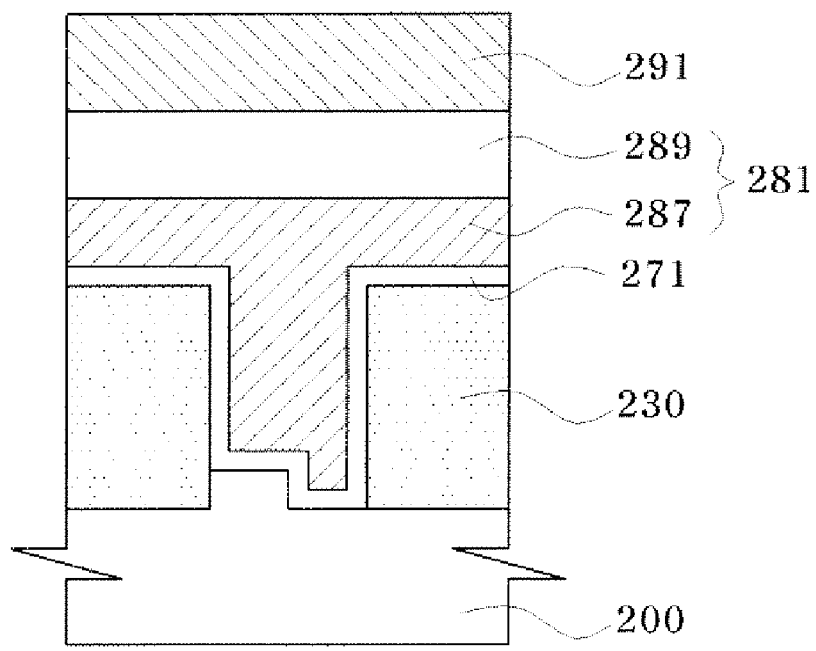

Referring to FIGS. 14 and 15, a hard mask pattern 291 is formed by patterning the hard mask layer 290 with a photolithography process. The hard mask pattern 291 is used as an etching mask to form a gate electrode including a gate conductive layer pattern 281 having a tungsten silicide layer pattern 289 and a polysilicon layer pattern 287 and a gate insulating layer pattern 271.

Although preferred embodiments of the invention have been disclosed for illustrative purposes, those skilled in the art will appreciate that various modifications, additions and substitutions are possible, without departing from the scope and spirit of the invention as defined in the accompanying claims.

What is claimed is:

1. A semiconductor device having a modified recess channel gate comprising:
    a semiconductor substrate having an active region defined by a device isolation layer, wherein the active region extends in a major axis direction and a minor axis direction, and a width of the active region is defined in the minor axis direction;
    a trench formed in the active region, the trench comprising side walls and a bottom surface;
    a step formed at the bottom surface of the trench, the step comprising a lower surface, an upper surface, and a vertical surface, the vertical surface being connected substantially vertically between the lower surface and the upper surface, whereby the vertical surface is substantially perpendicular to the lower surface and the width of the active region; and
    a recess gate filling the trench comprising the step, wherein the step having the vertical surface increases an effective channel width of the recess gate relative to the width of the active region and increases an effective channel length of the recess gate relative to a depth of the trench.

2. The semiconductor device according to claim 1, wherein the stepped bottom surface extends through at least half of the active region in the minor axis direction thereof.

3. The semiconductor device according to claim 1, wherein the stepped bottom surface comprises an upper surface and a lower surface, the height difference between the upper and lower surfaces ranging from 100 Å to 500 Å.

4. The semiconductor device according to claim 1, wherein the trench has a depth of 1,000 Å to 1,500 Å.

5. The semiconductor device according to claim 1, wherein the recess gate includes a gate insulating layer, a gate conductive layer and a hard mask layer.

6. The semiconductor device according to claim 1, wherein the gate conductive layer comprises a polysilicon layer and a tungsten silicide layer.

7. The semiconductor device according to claim 1, wherein the bottom surface having the stepped profile comprising a first bottom surface and a stepped second bottom surface, wherein the stepped second bottom surface is located higher than the first bottom surface.

* * * * *